United States Patent
Ha et al.

(10) Patent No.: US 8,810,018 B2
(45) Date of Patent: Aug. 19, 2014

(54) STACKED INTEGRATED CIRCUIT PACKAGE SYSTEM WITH FACE TO FACE STACK CONFIGURATION

(75) Inventors: Jong-Woo Ha, Seoul (KR); Sang-Ho Lee, Kyounggi (KR); Soo-San Park, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 1671 days.

(21) Appl. No.: 11/307,382

(22) Filed: Feb. 3, 2006

(65) Prior Publication Data

US 2007/0181998 A1   Aug. 9, 2007

(51) Int. Cl.
*H01L 23/02*   (2006.01)

(52) U.S. Cl.
USPC .................. 257/678; 257/686; 257/E23.001

(58) Field of Classification Search
USPC ................................................ 257/678, 686
See application file for complete search history.

(56) References Cited

U.S. PATENT DOCUMENTS

| | | | |
|---|---|---|---|
| 6,414,385 B1 * | 7/2002 | Huang et al. | 257/690 |
| 6,472,758 B1 | 10/2002 | Glenn et al. | |
| 6,828,665 B2 | 12/2004 | Pu et al. | |
| 6,841,858 B2 | 1/2005 | Shim et al. | |
| 6,919,631 B1 | 7/2005 | Hoffman et al. | |
| 6,956,284 B2 | 10/2005 | Cady et al. | 257/685 |
| 6,962,865 B2 | 11/2005 | Hanaoka et al. | 438/618 |
| 6,964,915 B2 | 11/2005 | Farnworth et al. | 438/460 |
| 6,965,160 B2 | 11/2005 | Cobbley et al. | 257/686 |
| 6,977,439 B2 | 12/2005 | Kang et al. | |
| 2003/0038357 A1 * | 2/2003 | Derderian | 257/686 |
| 2006/0284298 A1 * | 12/2006 | Kim et al. | 257/686 |

* cited by examiner

*Primary Examiner* — Elias M Ullah

(74) *Attorney, Agent, or Firm* — Ishimaru & Associates LLP

(57) ABSTRACT

A stacked integrated circuit package system is provided forming a first molded chip comprises attaching a conductor on a wafer, applying an encapsulant around the conductor, and exposing a surface of the conductor in the encapsulant, attaching a first electrical interconnect on the conductor of the first molded chip and stacking an integrated circuit device on the first molded chip with an electrical connector of the integrated circuit device connected to the conductor of the first molded chip with the first electrical interconnect.

10 Claims, 5 Drawing Sheets

STACKED INTEGRATED CIRCUIT PACKAGE SYSTEM WITH FACE TO FACE STACK CONFIGURATION

TECHNICAL FIELD

The present invention relates generally to integrated circuit packages and more particularly to stacked integrated circuit packages.

BACKGROUND ART

Consumer electronics requirements demand more integrated circuits in an integrated circuit package while paradoxically providing less physical space in the system for the increased integrated circuits content. Cost reduction is a continuous requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

Modern consumer electronics, such as smart phones, personal digital assistants, and location based services devices, are packing more integrated circuits into an ever shrinking physical space with expectations for decreasing cost. Numerous technologies have been developed to meet these requirements. Some of the research and development strategies focus on new package technologies while others focus on improving the existing and mature package technologies. Research and development in the existing package technologies may take a myriad of different directions.

One proven way to reduce cost is to use mature package technologies with existing manufacturing methods and equipments. Paradoxically, the reuse of existing manufacturing processes does not typically result in the reduction of package dimensions. Still the demand continues for lower cost, smaller size and more functionality. Continued integration and stacking of integrated circuits into a single integrated circuit package increases manufacturing complexity with decreased yield resulting in increased package cost, height, or both.

A variation of existing technologies uses mature package technologies with spacers between the integrated circuits of the stack. However, fabrication and insertion of the spacers require additional or separate manufacturing processes from the integrated circuit manufacturing process or the stack packaging process. Spacers may present other problems, such as uniform height or different size, to fit the various integrated circuit sizes in a stacked configuration.

Thus, a need still remains for a stacked integrated circuit package system providing low cost, low profile, and high yield. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides forming a first molded chip comprises attaching a conductor on a wafer, applying an encapsulant around the conductor, and exposing a surface of the conductor in the encapsulant, attaching a first electrical interconnect on the conductor of the first molded chip and stacking an integrated circuit device on the first molded chip with an electrical connector of the integrated circuit device connected to the conductor of the first molded chip with the first electrical interconnect.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
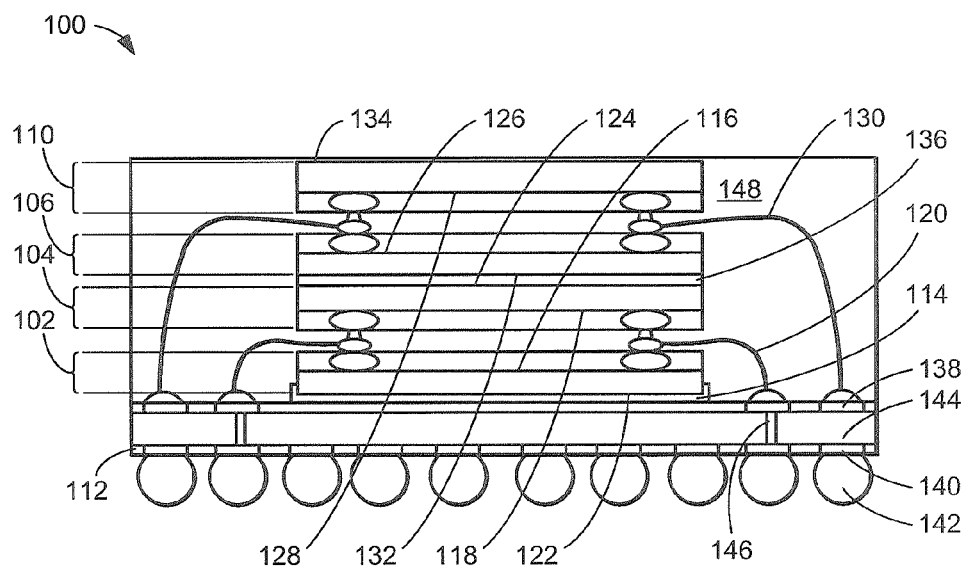
FIG. 1 is a cross-sectional view of a stacked integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Referring now to FIG. 1, therein is shown a cross-sectional view of a stacked integrated circuit package system 100 in an embodiment of the present invention. The stacked integrated circuit package system 100 includes a first molded chip 102 below a second molded chip 104, a third molded chip 106 stacked above the second molded chip 104, and a fourth molded chip 110 above the third molded chip 106. The first molded chip 102 attaches to a substrate 112 with a substrate adhesive 114.

A first active side 116 of the first molded chip 102 and a second active side 118 of the second molded chip 104 face each other in the stack such that first electrical interconnects 120, such as bond wires, simultaneously connect the first molded chip 102 and the second molded chip 104 to the substrate 112. The face to face configuration enables efficient electrical connections reducing packaging problems, such as bond wire crossings, and forming a low height of the stacked integrated circuit package system 100 compared to separately connecting to the first molded chip 102 and the second molded chip 104. The first molded chip 102 and the second molded chip 104 also have a first non-active side 122 and a second non-active side 124.

A third active side 126 of the third molded chip 106 and a fourth active side 128 of the fourth molded chip 110 face each other in the stack such that second electrical interconnects 130, such as bond wires, connect the third molded chip 106 and the fourth molded chip 110 to the substrate 112. Similarly, this face to face configuration enables efficient electrical connections reducing packaging problems, such as bond wire crossings, and forming a low height of the stacked integrated circuit package system 100 compared to separately connecting to the third molded chip 106 and the fourth molded chip. The third molded chip 106 and the fourth molded chip 110 also have a third non-active side 132 and a fourth non-active side 134. The third non-active side 132 attaches to the second non-active side 124 with a stacking adhesive 136.

The face to face configuration may also serve to minimize the lateral dimensions, the length and width, of the stacked integrated circuit package system 100 by not requiring separate bonding pads on the separate. As more molded chips are stacked, separate connections to each of the molded chips will require more bonding pads on the substrate 112 increasing the lateral dimensions of the stacked integrated circuit package system 100.

The substrate 112 includes a top metal layer 138 for electrical connections to the stack of the first molded chip 102 through the fourth molded chip 110 and a bottom metal layer 140 connecting to external interconnects 142, such as solder balls. The external interconnects 142 are used to connect the stacked integrated circuit package system 100 to the next system level (not shown). An insulating material 144, such as a dielectric material, isolates and separates the conductive regions of the top metal layer 138 and the bottom metal layer 140 as well as the top metal layer 138 from the bottom metal layer 140. An electrical via 146 connects the top metal layer 138 and the bottom metal layer 140 as required.

For illustrative purpose, the substrate 112 is shown as a two layers, although it is understood the number of layers may differ, as well.

An encapsulant 148 covers the first molded chip 102, the second molded chip 104, the third molded chip 106, the fourth molded chip 110, the first electrical interconnects 120, the second electrical interconnects 130, and a top surface of the substrate 112.

Figure 2:
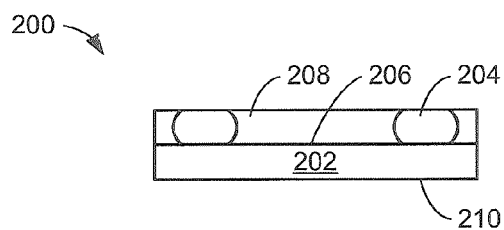
FIG. 2 is a more detailed cross-sectional view of the first molded chip.

Referring now to FIG. 2, therein is shown a more detailed cross-sectional view of a molded chip 200. The molded chip 200 includes an integrated circuit die 202 with conductors 204, such as interconnects, solder bumps, bonding wire, or stud bumps, attached to bonding pads (not shown) of an active side 206 of the integrated circuit die 202. A top mold 208 encapsulates, supports, and exposes the conductors 204 for further electrical connections as well as protects the active side 206. A plane formed by all of the exposed portion of the conductors 204 is coplanar to a plane of the top mold 208 opposite the active side 206. The integrated circuit die 202 also has a non-active side 210.

The molded chip 200 is an example of the structure of the first molded chip 102, the second molded chip 104, the third molded chip 106, and the fourth molded chip 110. The integrated circuit die 202 may be substantially the same, similar, or different between the first molded chip 102 of FIG. 1, the second molded chip 104 of FIG. 1, the third molded chip 106 of FIG. 1, and the fourth molded chip 110 of FIG. 1.

It has been discovered that stacking molded chips with a face to face configuration enables packing more integrated circuit content into a single package while providing optimally minimum dimensions, such as the height, width, and length, and low cost. The face to face configuration provides optimal stacking configuration of the molded chips reducing wire bonding complexity and reducing space required on the substrate 112. The molded chips are efficiently, cost effectively, and reliably formed during integrated circuit manufacturing at the wafers level with existing processes and equipments.

Figure 3:
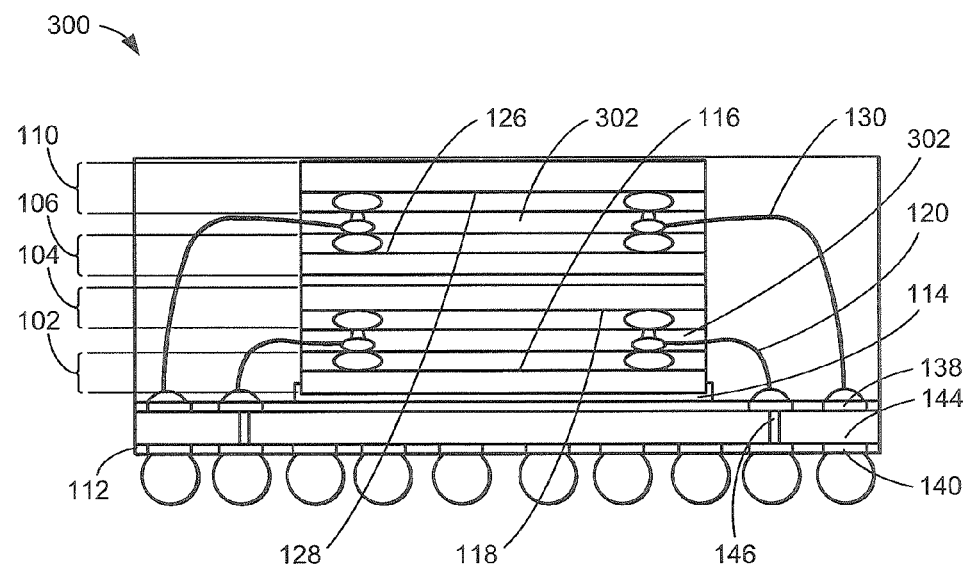
FIG. 3 is a cross-sectional view of a stacked integrated circuit package system in an alternative embodiment of the present invention.

Referring now to FIG. 3, therein is shown a cross-sectional view of a stacked integrated circuit package system 300 in an alternative embodiment of the present invention. The stacked integrated circuit package system 300 includes the first molded chip 102 below the second molded chip 104, the third molded chip 106 stacked above the second molded chip 104 with a spacer adhesive 302, and the fourth molded chip 110 above the third molded chip 106. The first molded chip 102 attaches to the substrate 112 with the substrate adhesive 114. For illustrative purpose, the spacer adhesive 302 is shown providing separation for the first molded chip 102 and the second molded chip 104, although it is understood that the separation may be achieved with other means, such as a silicon spacer or a film.

The first active side 116 of the first molded chip 102 and the second active side 118 of the second molded chip 104 face each other in the stack such that the first electrical interconnects 120, such as bond wires, simultaneously connect the first molded chip 102 and the second molded chip 104 to the substrate 112. The spacer adhesive 302 is between the first active side 116 and the second active side 118.

The third active side 126 of the third molded chip 106 and the fourth active side 128 of the fourth molded chip 110 face each other in the stack such that the second electrical interconnects 130, such as bond wires, connect the third molded chip 106 and the fourth molded chip 110 to the substrate 112. The spacer adhesive 302 is between the third active side 126 and the fourth active side 128.

The substrate 112 includes the top metal layer 138 and the bottom metal layer 140 with the electrical via 146 connecting the top metal layer 138 and the bottom metal layer 140. The insulating material 144 isolates and separates the conductive regions of the top metal layer 138 and the bottom metal layer 140 as well as the top metal layer 138 from the bottom metal layer 140.

Figure 4:
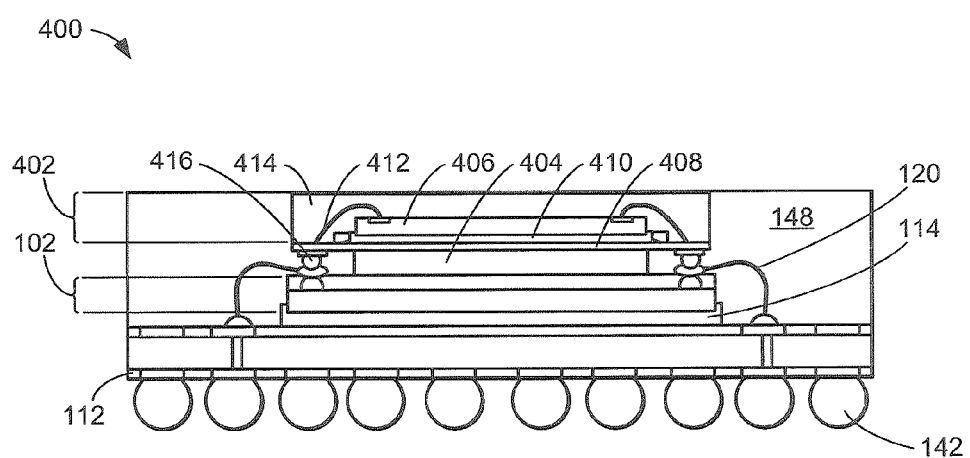
FIG. 4 is a cross-sectional view of a stacked integrated circuit package system in another alternative embodiment of the present invention.

Referring now to FIG. 4, therein is shown a cross-sectional view of a stacked integrated circuit package system 400 in another alternative embodiment of the present invention. The stacked integrated circuit package system 400 is a package in package configuration with the first molded chip 102 stacked below a package 402 with a spacer 404, such as an adhesive or film, between the first molded chip 102 and the package 402. The first molded chip 102 attaches to the substrate 112 with the substrate adhesive 114.

The package 402 includes an integrated circuit die 406 attached to a carrier 408 with a carrier adhesive 410. Electrical structures 412, such as bond wires, connect the integrated circuit die 406 to the carrier 408. A molding compound 414 encapsulates the integrated circuit die 406, the electrical structures 412, and the top of the carrier 408. Bumps 416 attach to the bottom of the carrier 408. The spacer 404 provides a separation between the first molded chip 102 and the package 402 for the first electrical interconnects 120 to connect the substrate 112 to the bumps 416 and the first molded chip 102.

The encapsulant 148 encases the first molded chip 102, the spacer 404, the package 402, the first electrical interconnects 120, and the top surface of the substrate 112 forming the package in package structure. The external interconnects 142 connect to the bottom of the substrate 112.

Figure 5:
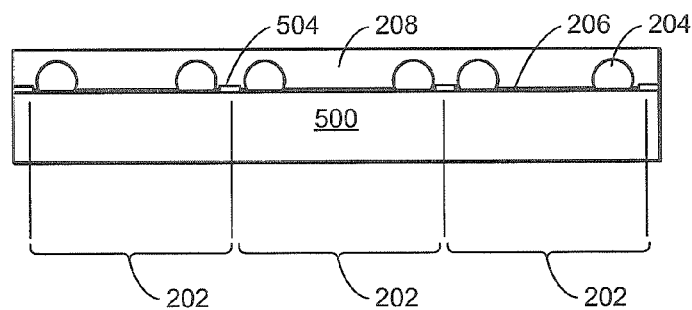
FIG. 5 is a cross-sectional view of a wafer in a top molding phase.

Referring now to FIG. 5, therein is shown a cross-sectional view of a wafer 500 in a top molding phase. The wafer 500 includes a number of the integrated circuit die 202 unsingulated with the conductors 204 on the active side 206 of the wafer 500. The conductors 204 may be formed on the wafer 500 by conventional bumping processes with a number of materials, such as aluminum, silver, or an alloy, for good bondability with the targeted material, such as copper, silver, palladium, aluminum, or gold, of the first electrical interconnects 120 of FIG. 1 and the second electrical interconnects 130 of FIG. 1. The conductors 204 may include solder as an alloy, such as tin/lead, tin/silver/copper, or semi-older, such as 70% gold or high percentage of copper in solder, for bondability.

The top mold 208 covers and mechanically supports the conductors 204 as well as protects the active side 206. Saw streets 504 provide markers for conventional singulation equipment, such as a saw, between the integrated circuit die 202 keeping the manufacturing cost down.

Figure 6:
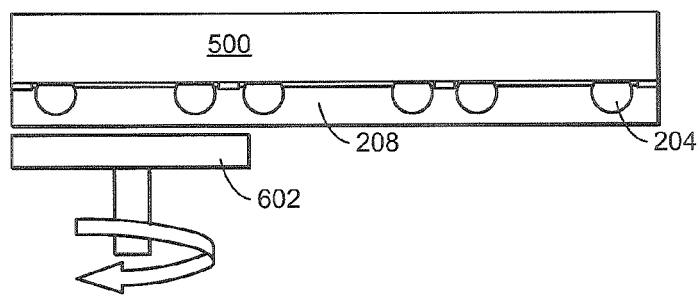
FIG. 6 is a cross-sectional view of the wafer of FIG. 5 in a molding grind phase.

Referring now to FIG. 6, therein is shown a cross-sectional view of the wafer 500 of FIG. 5 in a molding grind phase. A grinding wheel 602 removes a portion of the top mold 208 exposing the conductors 204 to form further electrical connections. The surface grinding of the top mold 208 may be performed with conventional equipments and processes keeping the manufacturing cost down.

Figure 7:
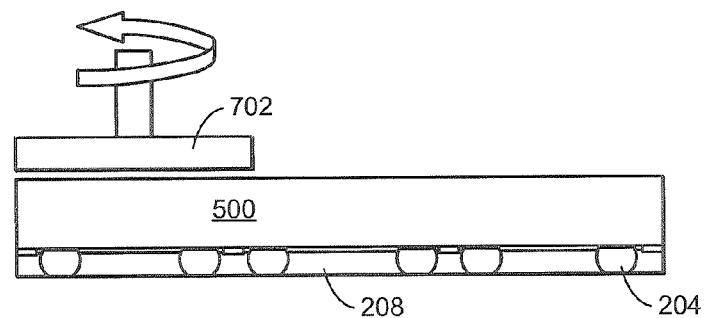
FIG. 7 is a cross-sectional view of the wafer of FIG. 6 in a thinning phase.

Referring now to FIG. 7, therein is shown a cross-sectional view of the wafer 500 of FIG. 6 in a thinning phase. The wafer 500, with the conductors 204 exposed, undergoes a back grind with a thinning wheel 702. The top mold 208 also provides planar rigidity mitigating wafer warpage allowing for more aggressive thinning, as desired. Additional thinning may mitigate the thickness added by the top mold 208.

Figure 8:
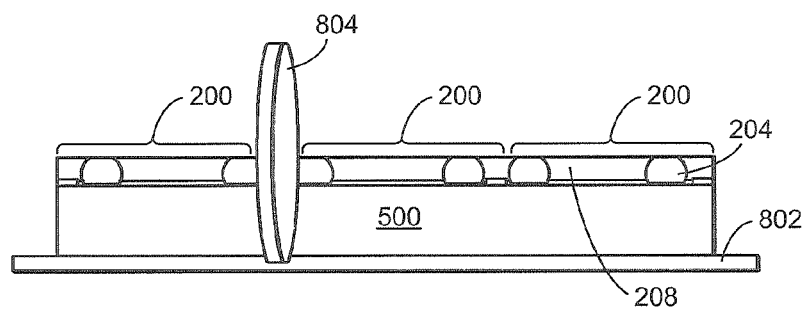
FIG. 8 is a cross-sectional view of the wafer of FIG. 7 in a singulation phase.

Referring now to FIG. 8, therein is shown a cross-sectional view of the wafer 500 of FIG. 7 in a singulation phase. The wafer 500 of FIG. 7 is attached to a dicing tape 802. A saw 804 singulates the wafer 500 at the saw streets 504 of FIG. 5 forming a number of the molded chips 200. The molded chip 200 has the conductors 204 in the top mold 208.

Figure 9:
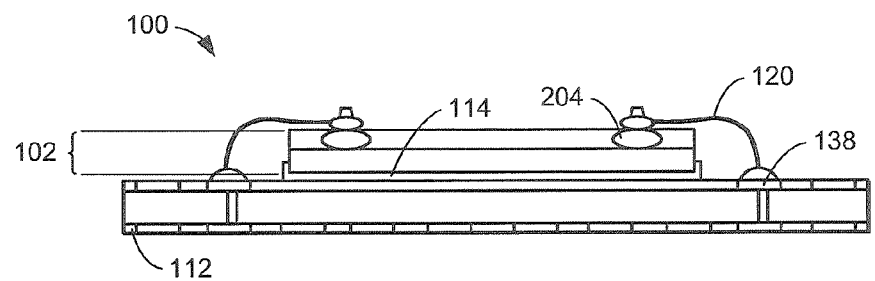
FIG. 9 is a cross-sectional view of the stacked integrated circuit package system in a mounting phase of the first molded chip.

Referring now to FIG. 9, therein is shown a cross-sectional view of the stacked integrated circuit package system 100 in a mounting phase of the first molded chip 102. The first molded chip 102 may be picked off the dicing tape 802 of FIG. 8 and placed on the substrate adhesive 114 to mount on the substrate 112. The first electrical interconnects 120 connect the top metal layer 138 to the conductors 204.

Figure 10:
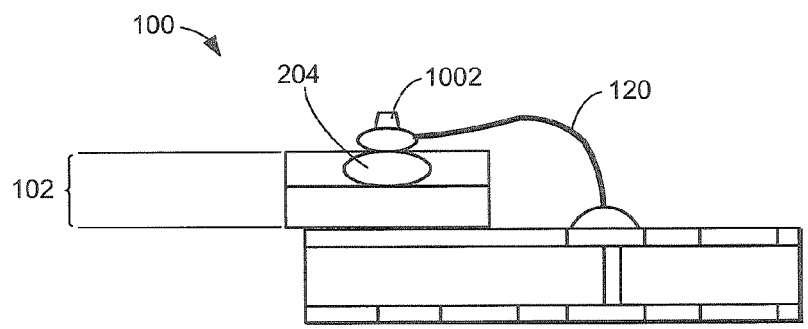
FIG. 10 is a more detailed cross-sectional view of the stacked integrated circuit package system in the mounting phase of the first molded chip.

Referring now to FIG. 10, therein is shown a more detailed cross-sectional view of the stacked integrated circuit package system 100 in the mounting phase of the first molded chip 102. The first electrical interconnects 120 may be stitched to the conductors 204 providing a lower arc of the first electrical interconnects 120 for a low profile package. Conventional wire bonding process creates wire loops increasing the separation required between stacking elements resulting in increased package height. A bump 1002 is formed on the stitch bond for further electrical connections.

Figure 11:
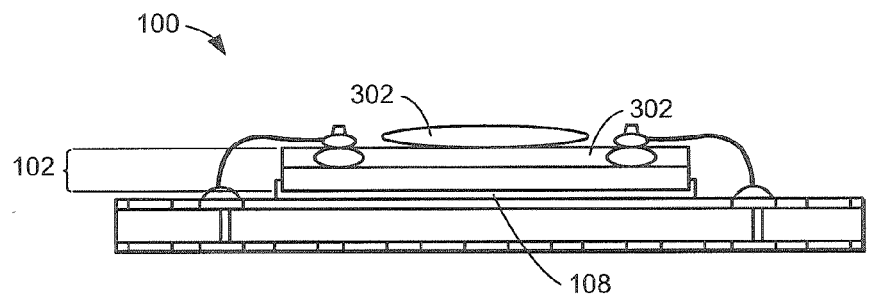
FIG. 11 is a cross-sectional view of the stacked integrated circuit package system in an optional spacer phase of the structure in FIG. 10.

Referring now to FIG. 11, therein is shown a cross-sectional view of the stacked integrated circuit package system 100 in an optional spacer phase of the structure in FIG. 10. The spacer adhesive 302 may be applied on the top mold 208 to create separation for stacking another element over the first molded chip 102. The separation may alternatively be created by the encapsulant 148 of FIG. 1 during the molding process of the stacked integrated circuit package system 100.

Figure 12:
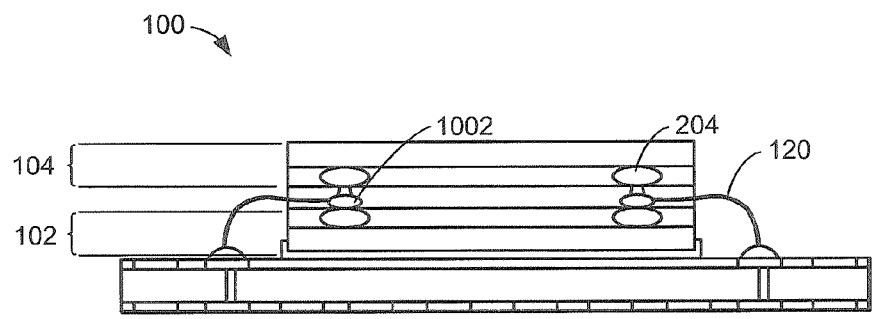
FIG. 12 is a cross-sectional view of the stacked integrated circuit package system in a stacking phase of the structure in FIG. 11.

Referring now to FIG. 12, therein is shown a cross-sectional view of the stacked integrated circuit package system 100 in a stacking phase of the structure in FIG. 11. The second molded chip 104 is stacked on the first molded chip 102. The bump 1002 is reflowed forming connections to the conductors 204 of the first molded chip 102 and the second molded chip 104 as well as maintaining connection with the first electrical interconnects 120.

Figure 13:
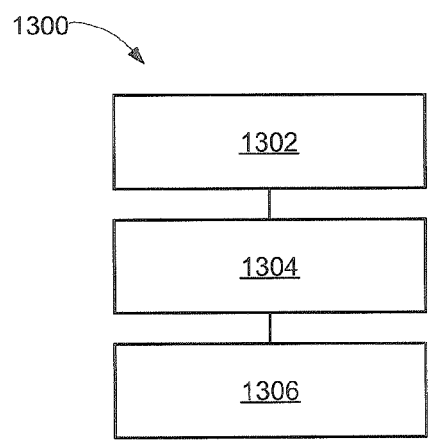
FIG. 13 is a flow chart of a stacked integrated circuit package system for manufacture of the stack integrated circuit package in an embodiment of the present invention.

Referring now to FIG. 13, therein is shown a flow chart of a stacked integrated circuit package system 1300 for manufacture of the stack integrated circuit package in an embodiment of the present invention. The system 1300 includes forming a first molded chip comprises attaching a conductor on a wafer, applying an encapsulant around the conductor, and exposing a surface of the conductor in the encapsulant in a block 1302; attaching a first electrical interconnect on the conductor of the first molded chip in a block 1304; and stacking an integrated circuit device on the first molded chip with an electrical connector of the integrated circuit device connected to the conductor of the first molded chip with the first electrical interconnect in a block 1306.

It has been discovered that the present invention thus has numerous aspects.

It has been discovered that stacking molded chips with a face to face configuration enables packing more integrated circuit content into a single package while providing optimally minimum dimensions, such as the height, width, and length, and low cost. The face to face configuration provides optimal stacking configuration of the molded chips reducing wire bonding complexity and reducing space required on the substrate 112. The molded chips are efficiently, cost effectively, and reliably formed during integrated circuit manufacturing at the wafer level with existing processes and equipments.

An aspect is that the present invention is that the molded chip formed with an encapsulation of the solder bumps attached on the active side of the wafer. The encapsulation provides the necessary support and structure for the solder bumps to withstand the mold grinding process to expose the solder bumps. The encapsulation also provides structural support also during wire bonding and package encapsulation.

Another aspect of the present invention is that the face to face configuration of the molded chip allows a single bond wire to connect to two molded chips. This decreases the height requirement of the stack and the package. The single bond wire connection also minimize the number of different wire bond connections needed reducing the substrate lateral dimension for a smaller footprint package as well as reducing wire bond crossing problems.

Yet another aspect of the present invention is that the face to face configuration in a stack may be achieved with a molded chip or another form of device providing similar or substantially same benefits as with two molded chips stacked in the face to face configuration.

Thus, it has been discovered that the stacked integrated circuit package system method of the present invention furnishes important and heretofore unknown and unavailable solutions, capabilities, and functional aspects for increasing chip density in systems. The resulting processes and configurations are straightforward, cost-effective, uncomplicated, highly versatile and effective, can be implemented by adapting known technologies, and are thus readily suited for efficiently and economically manufacturing stacked integrated circuit package in packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A method for manufacturing a stacked integrated circuit package system comprising:
   forming a first molded chip comprises:
      attaching a conductor on a die,
      applying an encapsulant around the conductor, and
      exposing a surface of the conductor in the encapsulant with a plane formed by all of the exposed portion coplanar to a plane formed by a side of the encapsulant opposite the die;
   attaching a first electrical interconnect on the conductor of the first molded chip; and
   stacking an integrated circuit device on the first molded chip with an electrical connector of the integrated circuit device connected to the conductor of the first molded chip with the first electrical interconnect.

2. The method as claimed in claim 1 wherein stacking the integrated circuit device on the first molded chip comprises forming a second molded chip having a similar structure to the first molded chip.

3. The method as claimed in claim 1 wherein stacking the integrated circuit device on the first molded chip comprises:
   forming a package having an integrated circuit die on a carrier;
   connecting a bond wire to the integrated circuit die and carrier;
   attaching the electrical connector to the carrier on a side opposite of the integrated circuit die; and
   encapsulating a molding compound around the integrated circuit die, the bond wire, and a top of the carrier.

4. The method as claimed in claim 1 wherein stacking the integrated circuit device on the first molded chip comprises applying a spacer adhesive between the first molded chip and the integrated circuit device.

5. The method as claimed in claim 1 further comprising:
   attaching a third molded chip on the integrated circuit device;
   attaching a second electrical interconnect to the conductor of the third molded chip; and
   stacking a fourth molded chip on the third molded chip with the conductor of the fourth molded chip connected to the conductor of the third molded chip with the second electrical interconnect.

6. A method for manufacturing a stacked integrated circuit package system comprising:
   forming a first molded chip comprises:
      attaching conductors on an active side of a wafer,
      applying a top mold around the conductors on the active side,
      exposing a surface of the conductors in the top mold, and
      singulating integrated circuit dies from the wafer, the integrated circuit dies have the conductors surrounded by the top mold with a plane formed by all of the exposed portion of the conductors coplanar to a plane formed by a side of the top mold opposite the die;
   attaching electrical interconnects on the conductors of the first molded chip; and
   stacking an integrated circuit device on the first molded chip with electrical connectors of the integrated circuit device connected to the conductors of the first molded chip with the electrical interconnects.

7. The method as claimed in claim 6 wherein attaching the electrical interconnects on the conductors comprises:
   attaching wire stitches on the conductors of the first molded chip; and
   forming bumps on the wire stitches.

8. The method as claimed in claim 6 wherein attaching the electrical interconnects to the conductors comprises attaching the electrical interconnects to a substrate.

9. The method as claimed in claim 6 further comprising molding an encapsulant around the first molded chip, the integrated circuit device, and the electrical interconnects.

10. The method as claimed in claim 6 wherein attaching the conductors on the active side of the wafer comprises attaching solder bumps on the active side of the wafer.

* * * * *